(12) United States Patent
Fossum

(10) Patent No.: US 7,990,449 B2
(45) Date of Patent: Aug. 2, 2011

(54) HIGH DYNAMIC RANGE CASCADED INTEGRATION PIXEL CELL AND METHOD OF OPERATION

(75) Inventor: Eric R. Fossum, Wolfeboro, NH (US)

(73) Assignee: Aptina Imaging Corporation, George Town (KY)

( * ) Notice: Subject to any disclaimer, the term of this patent is extended or adjusted under 35 U.S.C. 154(b) by 406 days.

(21) Appl. No.: 12/236,987

(22) Filed: Sep. 24, 2008

(65) Prior Publication Data

US 2009/0021627 A1    Jan. 22, 2009

Related U.S. Application Data

(63) Continuation of application No. 11/088,978, filed on Mar. 24, 2005, now Pat. No. 7,442,910, which is a continuation of application No. 10/230,202, filed on Aug. 29, 2002, now Pat. No. 6,888,122.

(51) Int. Cl.
*H04N 3/14* (2006.01)
*H04N 5/335* (2011.01)

(52) U.S. Cl. ........ 348/294; 348/300; 348/301; 348/302; 348/308

(58) Field of Classification Search ................. 348/294, 348/300–302, 308; 250/208.1; 257/290–292
See application file for complete search history.

(56) References Cited

U.S. PATENT DOCUMENTS

| 5,329,112 A | * | 7/1994 | Mihara ...................... 250/208.1 |
| RE34,926 E | * | 5/1995 | Hieda et al. ................. 348/223.1 |
| 5,471,515 A | | 11/1995 | Fossum et al. |
| 5,625,210 A | | 4/1997 | Lee et al. |
| 6,204,524 B1 | | 3/2001 | Rhodes |
| 2003/0214591 A1 | | 11/2003 | Kakumoto |

* cited by examiner

*Primary Examiner* — Yogesh Aggarwal

(57) ABSTRACT

A cascaded imaging storage system for a pixel is disclosed for improving intrascene dynamic range. Charges accumulated in a first capacitor spill over into a second capacitor when a charge storage capacity of the first capacitor is exceeded. A third capacitor may also be provided such that charges accumulated by said second capacitor spill over into the third capacitor when the charge storage capacity of the second capacitor is exceeded.

1 Claim, 20 Drawing Sheets

BASIC CONFIGURATION

BASIC CONFIGURATION

RESET FILL

RESET SPILL

READ RESET LEVEL V0

INITIAL INTEGRATION

LOW LIGHT REGIME (L)
FINAL INTEGRATION LEVEL

READOUT (1) READ PD VOLTAGE

READOUT (2) OPEN T2, READ PD VOLTS

READOUT (3) OPEN T3, READ PD VOLTS

MEDIUM LIGHT REGIME (L)
FINAL INTEGRATION LEVEL

READOUT (1) READ PD VOLTAGE

READOUT (2) OPEN T2, READ PD VOLTS

READOUT (3) OPEN T3, READ PD VOLTS

HIGH LIGHT REGIME (L)
FINAL INTEGRATION LEVEL

READOUT (3) OPEN T3, READ PD VOLTS

INITIAL INTEGRATION

T2 STARTS INTEGRATION

T3 STARTS INTEGRATION

LOW LIGHT REGIME (L)
FINAL INTEGRATION LEVEL

READOUT (1)  READ PD VOLTAGE

READOUT (2) OPEN T2, READ PD VOLTS

READOUT (3) OPEN T3, READ PD VOLTS

LATER INTEGRATION
DISCARD SOME PHOTOSIGNAL

MEDIUM LIGHT REGIME (L)

MEDIUM LIGHT REGIME (L)
T3 STARTS INTEGRATION

READOUT (1) READ PD VOLTAGE

READOUT (2) OPEN T2, READ PD VOLTS $V2 = [Q(PDFULL) + T2 \times Iph]/C2eff$

READOUT (3) OPEN T3, READ PD VOLTS

HIGH LIGHT REGIME (L)
DISCARD MORE PHOTOSIGNAL

MEDIUM LIGHT REGIME (L)
T3 STARTS INTEGRATION

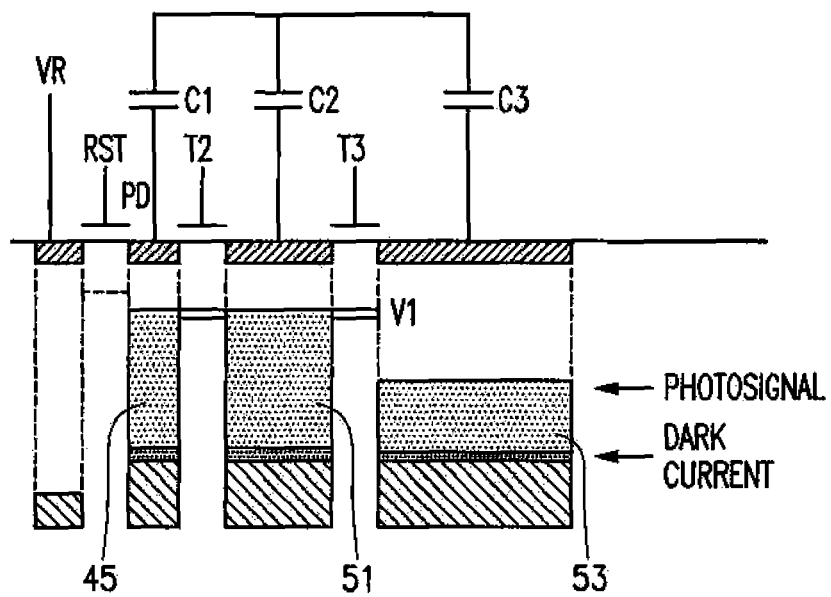
FIG. 33 READOUT (1) READ PD VOLTAGE
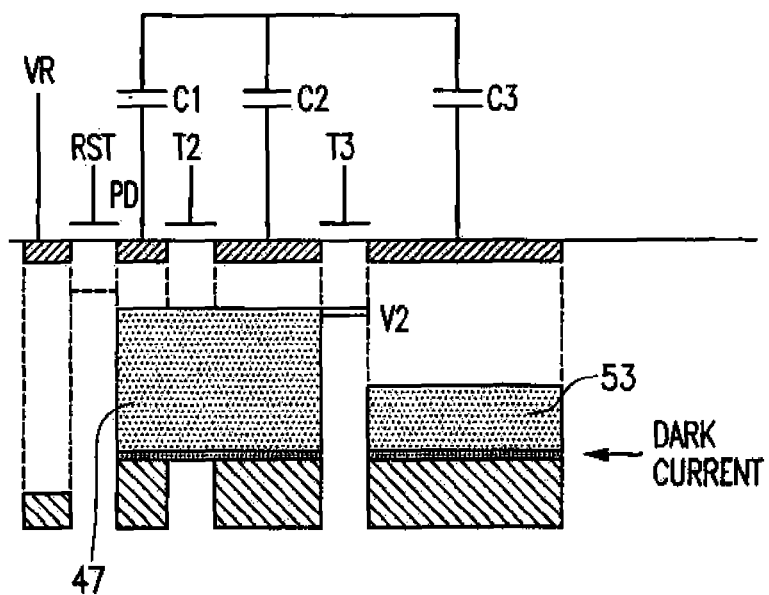
FIG. 34 READOUT (2) OPEN T2, READ PD VOLTS READOUT (3) OPEN T3, READ PD VOLTS
V3 = [Q(PDFULL) + Q(C2FULL) + T3xIph]/C3eff

RESET ON CAP-SIDE CONFIGURATION

2nd Alternate structure that does reset
through other side of cascade

TWO-PORT CASCADE CONFIGURATION
WITH RESET TO ONE CAPACITOR

TWO-PORT CASCADE CONFIGURATION
WITH RESET TO PD

Alternate structure that allows first cascade into C2 and still sequentially into C3. Even though T3 is adjacent to PD...just T3 is at higher barrier value

HIGH DYNAMIC RANGE CASCADED INTEGRATION PIXEL CELL AND METHOD OF OPERATION

CROSS REFERENCE TO RELATED APPLICATIONS

The present application is a continuation of U.S. patent application Ser. No. 11/088,978, filed on Mar. 24, 2005, now U.S. Pat. No. 7,442,910, which is a continuation of U.S. patent application Ser. No. 10/230,202, filed on Aug. 29, 2002, now U.S. Pat. No. 6,888,122, and the disclosures of which are incorporated by reference in their entirety.

FIELD OF THE INVENTION

The present invention is directed to improving the intrascene dynamic range of an imager pixel, particularly a pixel used in a CMOS active pixel image sensor.

BACKGROUND OF THE INVENTION

Intrascene dynamic range refers to the range of incident light that can be accommodated by an image sensor in a single frame of pixel data. Examples of scenes that generate high dynamic range incident signals include an indoor room with outdoor window, an outdoor scene with mixed shadows and bright sunshine, night-time scenes combining artificial lighting and shadows and, in an automotive context, an auto entering or about to leave a tunnel or shadowed area on a bright day.

Dynamic range is measured as the ratio of the maximum signal that can be meaningfully imaged by a pixel of the imager to its noise level in the absence of light. Typical CMOS active pixel sensors (and charge coupled device (CCD)) sensors have a dynamic range from 60 to 75 dB. This corresponds to light intensity ratios of 1000:1 to about 5000:1. Noise in image sensors, including CMOS active pixel image sensors, is typically between 10 and 50 e-rms. The maximum signal accommodated is approximately 30,000 to 60,000 electrons. The maximum signal is often determined by the charge-handling capacity of the pixel or readout signal chain. Smaller pixels typically have smaller charge handling capacity.

Typical scenes imaged by cameras have lighting levels that generate signals on the order of 10-1,000 electrons under low light (1-100 lux), 1000-10,000 electrons under indoor light conditions (100-1000 lux), and 10,000->1,000,000 electrons (1000-100,000 lux) under outdoor conditions. To accommodate lighting changes from scene to scene, the so-called interscene dynamic range, an electronic shutter is used to change the integration time of all pixels in the arrays from frame to frame.

To cover a single scene that might involve indoor lighting (100 lux) and outdoor lighting (50,000 lux), the required intrascene dynamic range is of the order of 5,000:1 (assuming 10 lux of equivalent noise) corresponding to 74 dB. In digital bits, this requires 13-14 bits of resolution. However, most CMOS active pixel sensors have only 10 bits of output and 8 bits of resolution typically delivered to the user in most image formats such as JPEG. Companding of the data is often used to go from 10-12 bits to 8 bits. One type of companding is gamma correction where roughly the square root of the signal is generated.

In order to accommodate high intrascene dynamic range, several different approaches have been proposed in the past. A common denominator of most is performance of signal companding within the pixel by having either a total conversion to a log scale (so-called logarithmic pixel) of a mixed linear and logarithmic response in the pixel. These approaches have several major drawbacks, generally speaking. First, the knee point in a linear-to-log transition is difficult to control leading to fixed pattern noise in the output image. Second, under low light the log portion of the circuit is slow to respond leading to lag. Third, a logarithmic representation of the signal in the voltage domain (or charge domain) means that small variations in signal due to fixed pattern noise leads to large variations in the represented signal.

Linear approaches have also been described where the integration time is varied during a frame to generate several different signals. This approach has architectural problems if the pixel is read out at different points in time since data must be stored in some on-board memory before the signals can be fused together. Another approach is to integrate two different signals in the pixel, one with low gain and one with high gain. However, the low gain portion of the pixel has color separation issues.

Many of these approaches to increasing intrascene dynamic range are described in the following articles.
1. Yadid-Pecht and Fossum, IEEE Trans. Electron Devices 44(10) p. 1721-1723 (1997.
2. Decker et al., IEEE JSSC, 33(12) pp. 2081-2091 (1998).
3. Yang et al., IEEE JSSC, 34 (12) pp. 1821-1834 (1999).
4. Wang et al., Pgm IEEE Workshop on CCDs/AIS (2001).
5. Stoppa, et al., ISSC Tech. Digest, 2002, pg. 40-41 (2002).

A pixel which can accommodate an intrascene dynamic range greater than 5000:1 would be beneficial for a variety of applications. The pixel must remain small, dissipate little or no power during integration, and preserve low light performance.

BRIEF SUMMARY OF THE INVENTION

The invention provides a new type of pixel which uses cascaded capacitors to achieve a high intrascene dynamic range. The present invention, in both method and apparatus aspects, provides a pixel cell in which the cascaded capacitors progressively store charges generated by a photoconversion element during a charge integration period. The generated charges, in effect, spill over from one capacitor to another for storage, as the charges are increasingly generated by the photoconversion element. The stored charges on all capacitors are then read out during a pixel photosignal read out period.

A method of operating a pixel cell as described above is also provided.

These and other features and advantage of the invention will be more clearly understood from the following detailed description which is provided below in conjunction with the accompanying drawings.

BRIEF DESCRIPTION OF THE DRAWINGS

FIG. 33 illustrates a further readout of the FIG. 1 pixel cell in accordance with the second method of operation;

FIG. 34 further illustrates a readout of the FIG. 1 pixel cell in accordance with the second method of operation;

DETAILED DESCRIPTION OF THE INVENTION

The invention employs cascaded capacitors for storing pixel signals. Although the invention will be described with reference to embodiments using three cascaded capacitors, the invention contemplates use of two or more cascaded capacitors to store pixel signals.

Figure 1:
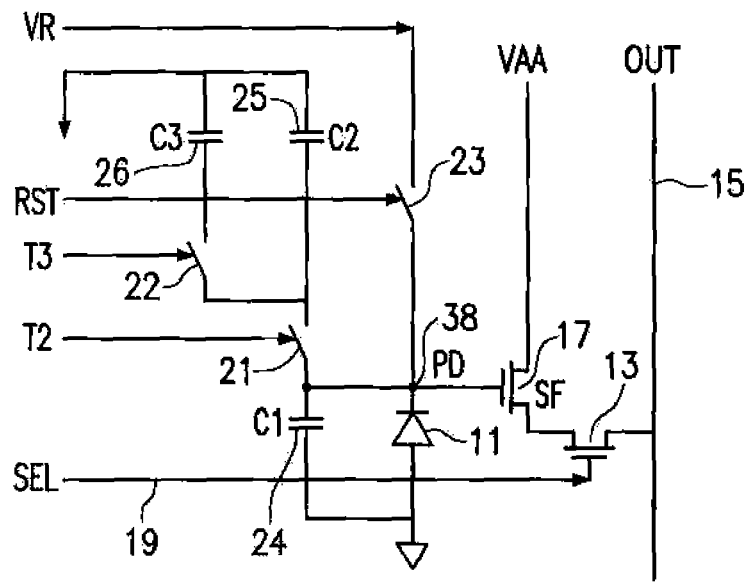
FIG. 1 illustrates a first embodiment of a pixel cell in accordance with the invention.

Referring now to FIG. 1, a first circuit embodiment of a pixel in accordance with the invention is illustrated. The pixel includes a photodiode 11 for converting photons to electrons; a reset transistor 23 which operates to reset a photodiode 11 to a voltage Vr during a reset period; a first capacitor 24 connected in parallel with photodiode 11 for storage charge; a second capacitor 25 coupled to the second charge collection area of photodiode 11 by a transfer transistor 21; a third capacitor 26 which is connected through a transfer transistor 22 and the transfer transistor 21 to photodiode 11; a source follower transistor 17 for reading out a voltage signal based on charges on the photodiode 11; and a row select access transistor 13 for coupling the output of the source follower transistor 17 to a column output line 15. A row selector 13 is activated by a signal on SEL line 19. Reset transistor 23 is controlled by a gate signal RST, whereas transfer transistor 21 and transfer transistor 22 are respectively controlled by gate signals T2 and T3. The capacitors 24, 25, 26 may have the same or different capacitance values and, but as one example, the capacitance of capacitor 26 is larger than that of capacitor 25 which is larger than that of capacitor 24.

The capacitor 24 which is parallel with photodiode 11 is preferably an intrinsic parasitic capacitance associated with the photodiode 11, or can be a discrete capacitor. The second and third capacitors 25 and 26 are discrete capacitors which are provided within the pixel circuit. As shown, the source follower transistor 17 is connected to a voltage source VAA, while the reset transistor 23 is connected to a reset voltage source VR. One terminal of capacitors 24, 25, 26 is connected to ground. Alternatively, the grounded terminals of the capacitors may instead be connected to VAA. As a farther alternative, the grounded terminals of capacitors 24, 25, 26 shown in FIG. 1 may be arranged so that one or more of capacitors 24, 25, 26 may have the grounded terminal connected to a respective bias source instead. For convenience of further discussion, the invention will be described with reference to having the one terminal of capacitors 24, 25 and 26 all connected to ground, as illustrated in FIG. 1.

As illustrated, the charge collection node of photodiode 11 has one capacitor 24 which is always connected thereto, and two additional capacitors 25 and 26 which can be connected thereto through respective switches 21 and 22. The capacitors 25, 26 provided in the pixel circuit of FIG. 1 serve to increase the intrascene dynamic range by storing additional charge which would otherwise saturate the pixel and provide no usable signal.

Figure 2:
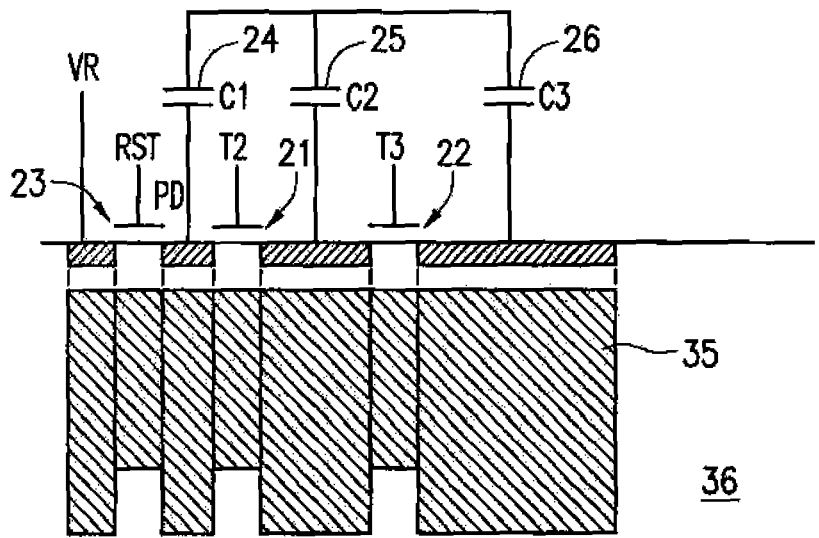
FIG. 2 illustrates the FIG. 1 embodiment as fabricated on a semiconductor substrate and showing a reset fill operation of the pixel cell of FIG. 1.

FIG. 2 illustrates how the pixel is laid out in a semiconductor substrate 36, for example, a silicon substrate, and with all three capacitors 24, 25, 26 having one terminal commonly connected to ground. It should be noted that source follower transistor 17 and row select transistor 13 are omitted from FIG. 2 for clarity purposes. As shown in FIG. 2, the charge storage node of the photodiode 11 also serves as one of the source/drain regions of the reset transistor 23, the other source/drain region of the reset transistor 23 being connected to the voltage supply VR. The first capacitor 24 has a terminal connected to the charge accumulation node of the photodiode. The charge accumulation node of the photodiode also serves as one source/drain region of the transfer transistor 21, while the other source/drain region of the transfer transistor is connected to a terminal of the second capacitor 25. The source/drain terminal of transistor 21 which connects to the terminal capacitor 25 also serves as a source/drain region of the transfer transistor 22, while the other source/drain region of transfer transistor 22 is connected to a terminal of the third capacitor 26.

A first method of operation of the FIG. 1 and FIG. 2 circuit will be described below with reference to FIGS. 1-17.

Figure 3:
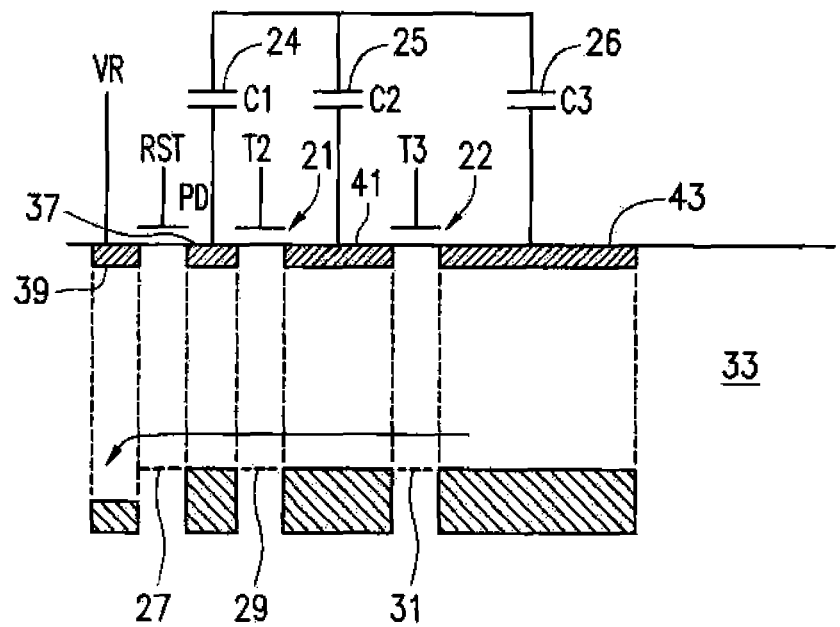
FIG. 3 illustrates a reset spill operation of the pixel of FIG. 1.

Referring first to FIG. 2, with reset transistor 23 and transfer transistors 21, 22 turned on, charge from the voltage source VR, which is initially at a low level, fills all of the source/drain region storage wells within the integrated device, as illustrated by numeral 35. VR is then increased to a higher voltage, and charge 35 is then allowed to bleed off to a reset level which is illustrated in FIG. 3 as a reset spill of the charge 35 back to the voltage source VR through the reset and transfer transistors 23, 21, 22. Thus, FIG. 3 illustrates a reset signal which has been collected by the photodiode at doped charge collection region 37.

Figure 4:
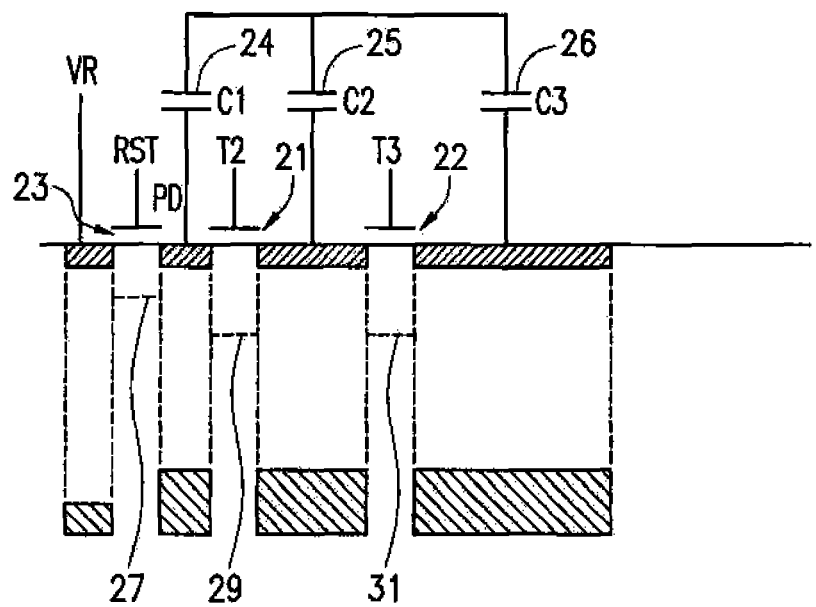
FIG. 4 illustrates a reset level read of the pixel cell of FIG. 1.

Following reset of the pixel as illustrated in FIGS. 2 and 3, a read operation occurs, as depicted in FIG. 4, in which the reset voltage is read from region 37 onto a column line 15 by the source follower transistor 17 and row access transistor 13, the latter of which is turned on by the row select signal SEL. Once the reset voltage level at doped region 37 is read out, a charge integration period next begins. It should be noted that in connection with FIGS. 3 and 4, when the reset voltage is read the gate voltage on the reset transistor 23 is lowered, as represented by the gate barrier level 27, causing the reset transistor to be turned off during the readout period illustrated in FIG. 4. Transistors 21 and 22 are partially off during reset voltage readout, as illustrated by the higher barrier potential levels 29 and 31 in FIG. 4.

As noted, the gate voltages of reset transistor 23 and the transfer transistors 21 and 22 are reflected as barrier potential levels in the substrate depictions of FIGS. 3 and 4. These barrier levels are illustrated as 27 for the reset gate, 29 for transfer gate 21, and 31 for the transfer gate 22. During operation of the device illustrated in FIGS. 1 and 2 as described above and further below, the barrier levels 27, 29 and 31, as controlled by the gate voltages on the respective transistors 23, 21 and 22, will change.

Figure 5:
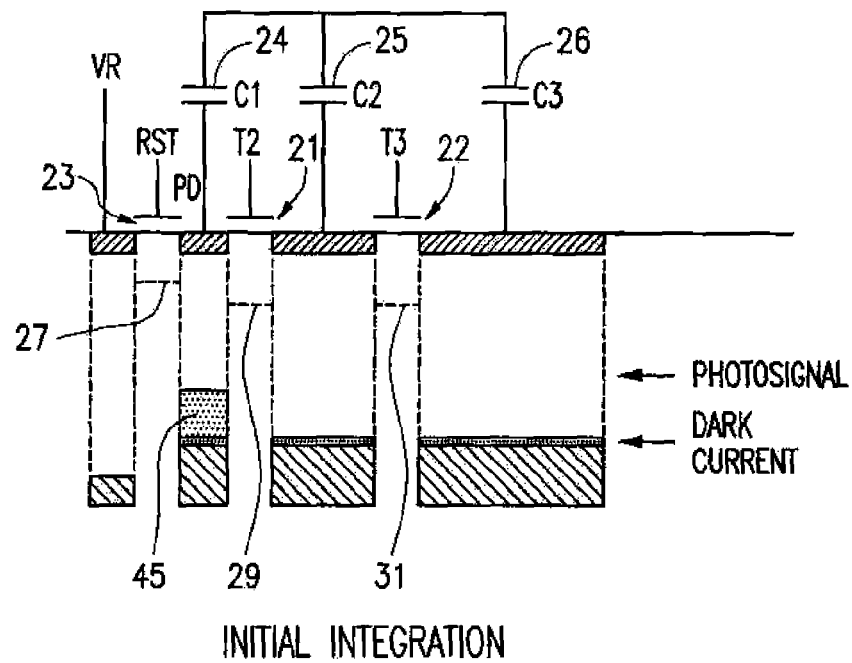
FIG. 5 illustrates a photo signal integration using the pixel cell of FIG. 1.
Figure 6:
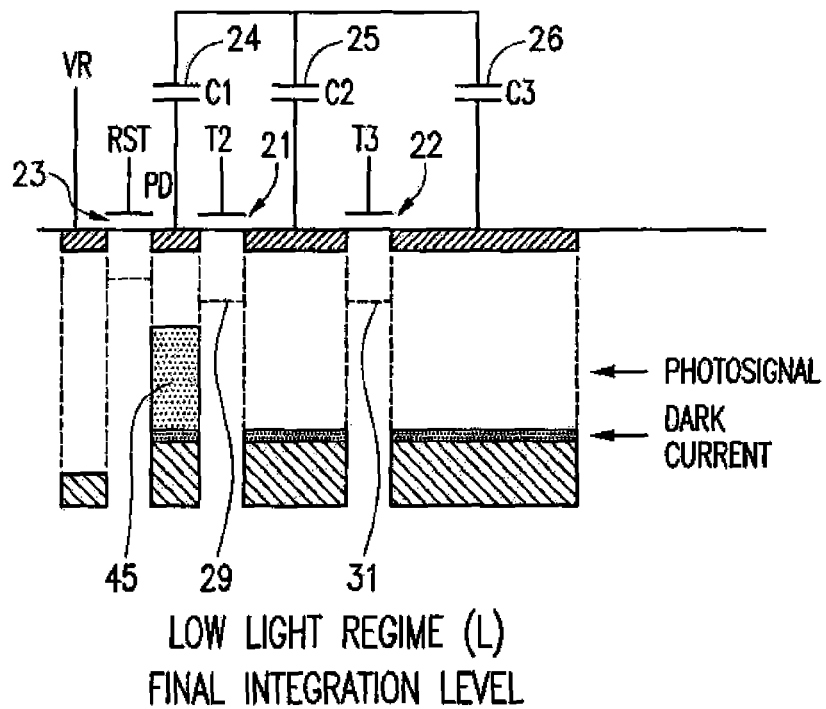
FIG. 6 illustrates a photo signal integration using the pixel cell of FIG. 1 in a low light condition.

After the reset period readout depicted in FIG. 4, the transfer transistors 21, 22 remain partially off. At this point, a charge integration period begins as depicted in FIG. 5. During the initial charge integration at the photodiode 11, photons are converted to electrons and are stored in the well associated with the photodiode 11, depicted in FIG. 5 as stored charge 45. These charges continue to build during the integration period as shown in FIG. 6. If the pixel is used in a low light environment, the charges will never exceed barrier level 29 for the transfer transistor 21 and will remain within the well of the photodiode region as shown in FIG. 6. After the integration period ends, a voltage readout occurs as illustrated in FIG. 7, in which the voltage at the photodiode 11 is now read out by the source follower transistor 17 and row access transistor 13 onto the column line 15.

Figure 7:
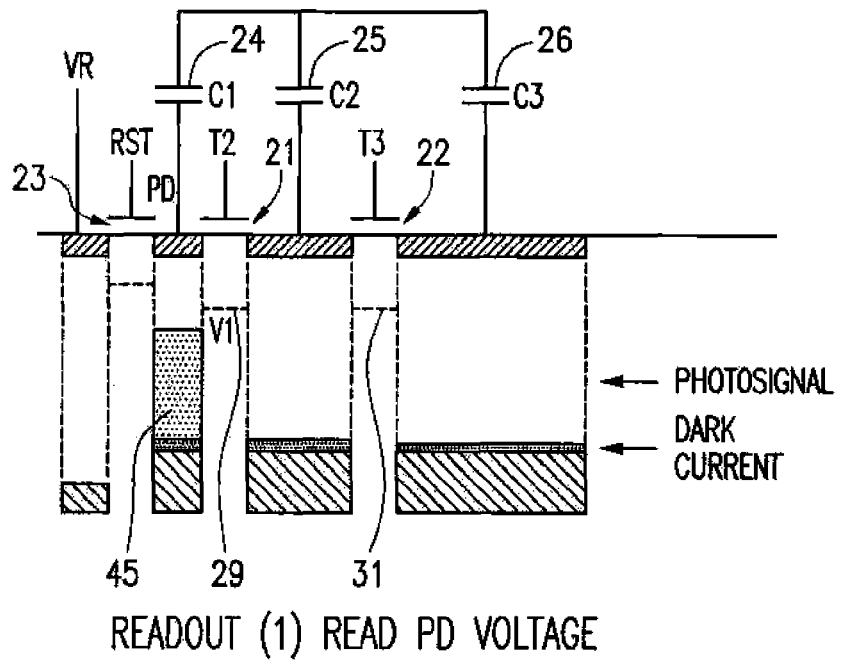
FIG. 7 illustrates the readout of the FIG. 1 pixel cell under low light conditions.
Figure 8:
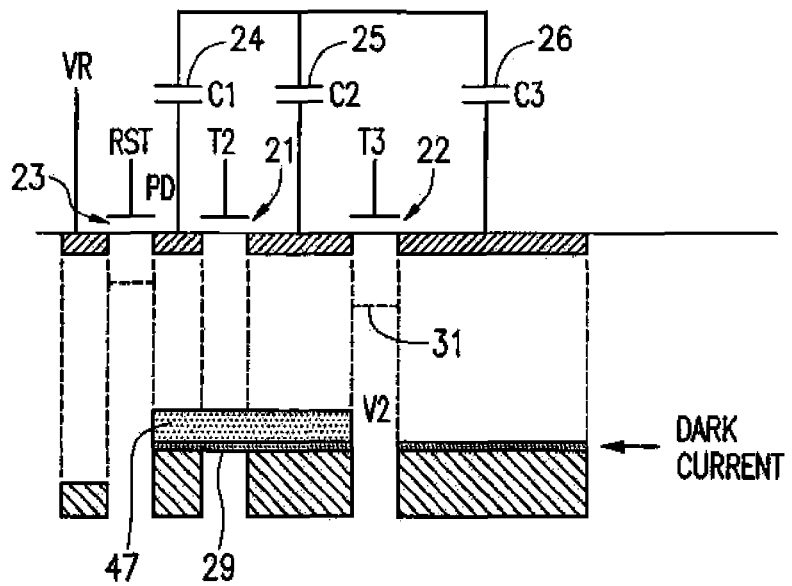
FIG. 8 illustrates a further readout operation of the FIG. 1 pixel cell under low light conditions.

Following an initial readout illustrated in FIG. 7, a second readout occurs where a gate voltage to the transistor 21 is applied to lower the barrier potential 29. This causes charges stored on capacitors C1 and C2 to be redistributed to equalize voltage levels as illustrated by charge 47 in FIG. 8. This voltage level is continually read out by the source follower transistor 17 and row select transistor 13 onto the column line 15.

Figure 9:
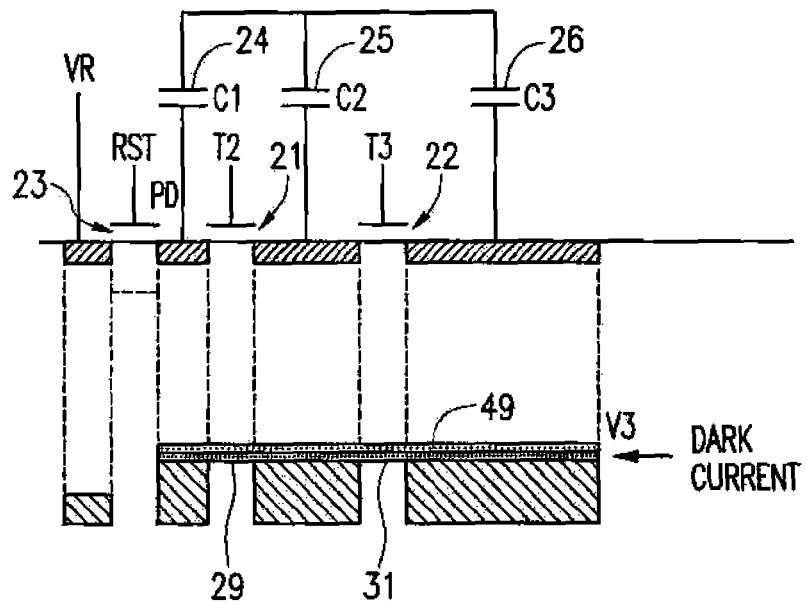
FIG. 9 illustrates a further readout of the FIG. 1 pixel under low light conditions.

Finally, as shown in FIG. 9, the transistor T3 is turned on, lowering barrier potential 31 which couples charge stored at capacitor C3 to the charge stored on capacitors C2 and C1, which is illustrated as voltage level 49. Since the charge stored on capacitor C3 during integration charge was nill, the voltage 49 which is read out at this point is very small.

FIGS. 2-9 illustrate operation of the FIG. 1 pixel cell during a low light condition. Operation of the FIG. 1 circuit in a medium light condition will now be described with reference to FIGS. 1-5 and 10-13.

Figure 10:
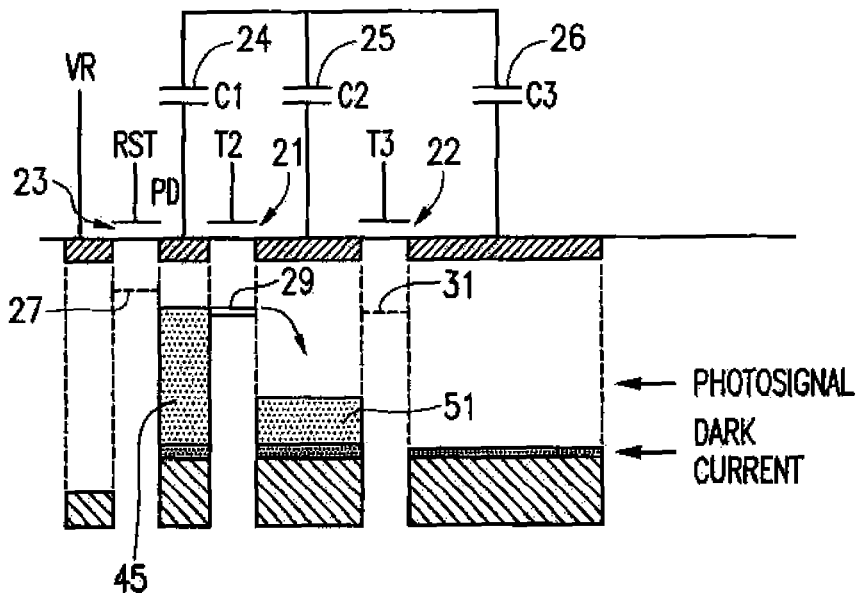
FIG. 10 illustrates a photo signal integration period of the FIG. 1 pixel cell under medium light conditions.

The pixel cell of FIG. 1 operates to reset and begin charge integration as described above with reference to FIGS. 2-6. When the accumulated charge 45 generated by photodiode 11 begins to approach the barrier level 29 set by a voltage applied to the gate of transistor 21, further accumulated charges spill over and become stored on the capacitor C2, as depicted in FIG. 10. The charge stored on capacitor C2 is illustrated as 51, while the arrow indicates spillover from the accumulated charge stored on capacitor 24 and onto the capacitor 25.

Figure 11:
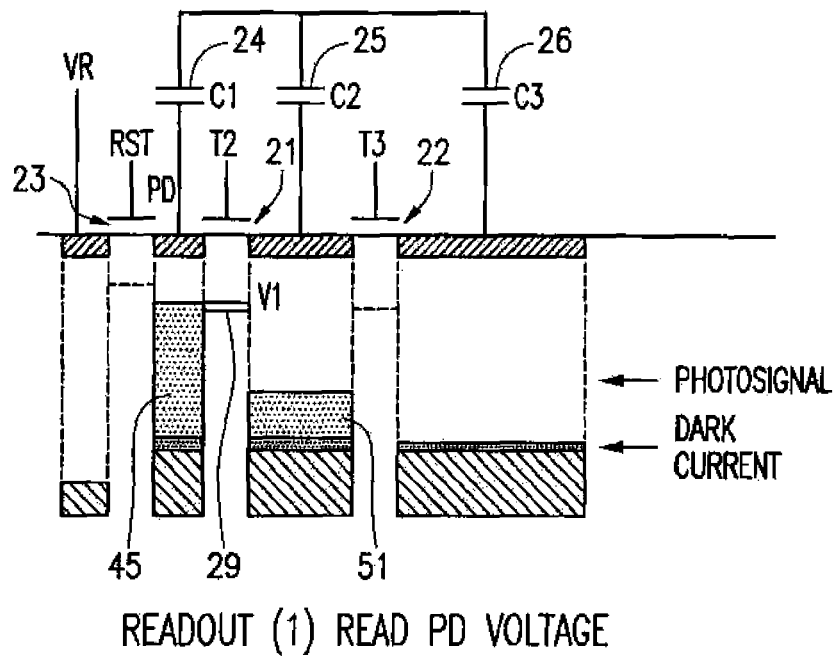
FIG. 11 illustrates the readout of the FIG. 1 pixel cell under medium light conditions.
Figure 12:
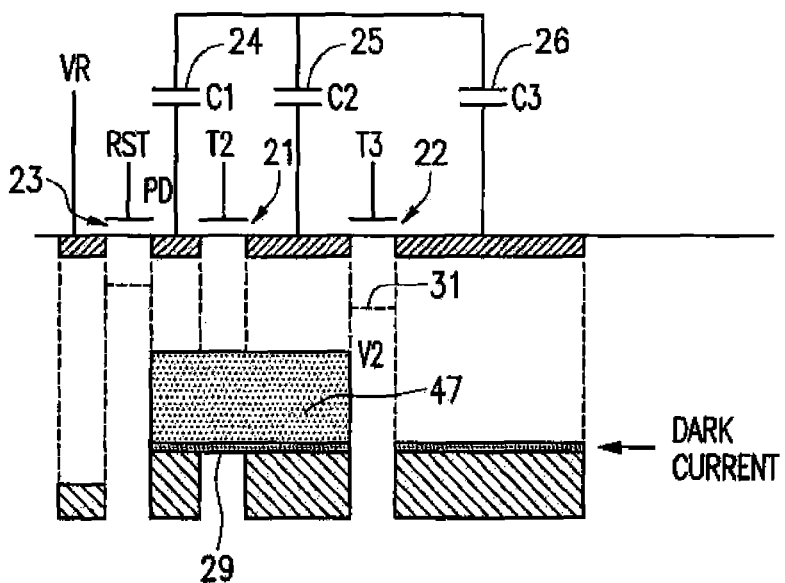
FIG. 12 illustrates a further readout of the FIG. 1 pixel cell under medium light conditions.
Figure 13:
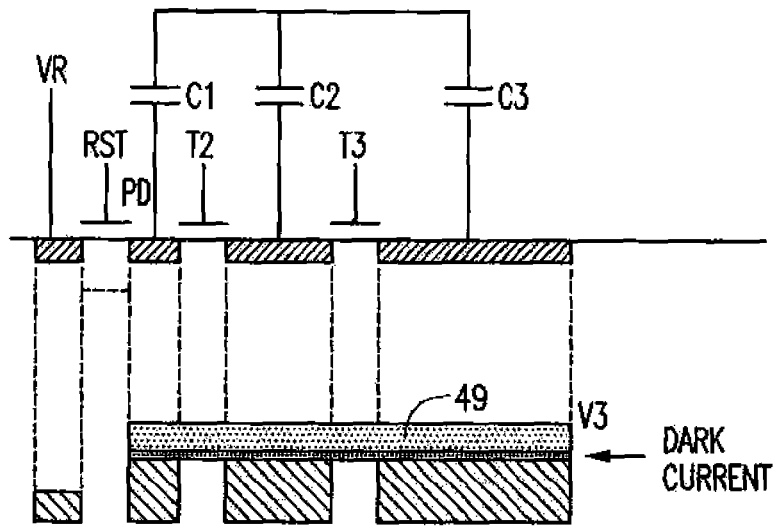
FIG. 13 illustrates a yet further readout of the FIG. 1 pixel cell under medium light conditions.

Since in this example of operation the incident light signal is at a medium light level, the accumulated charge can be sufficiently stored on capacitors 24 and 25 during the integration period. Accordingly, as illustrated in FIG. 11, charges 45 and 51 respectively stored on capacitors 24 and 25 are read out. First, as illustrated in FIG. 11, the voltage on the photodiode 11, read out, and thereafter the transfer transistor 21 is gated on to redistribute the charges and equalize the voltages on capacitors 24 and 25 being read out, as illustrated in FIG. 12. Finally, as depicted in FIG. 13, the transistor 22 is gated on by a gate signal at T3, which lowers the barrier 31 so that the charge is now redistributed across all three capacitors 24, 25 and 26, and the resultant voltage is read out through the source follower transistor 17 and row access transistor 13 onto the output line 15.

Thus, with a medium light signal, excess charge stored on capacitor 24 is spilled over and is stored on capacitor 25 in a cascaded fashion. However, under medium light conditions, the storage capacity of both capacitors 24 and 25 is sufficient to store the accumulated light signal so there is no spillover during charge integration onto capacitor 26.

Operation of the FIG. 1 pixel cell under conditions of high light intensity will now be described with reference to FIGS. 1-5, 10 and 14-17.

Figure 14:
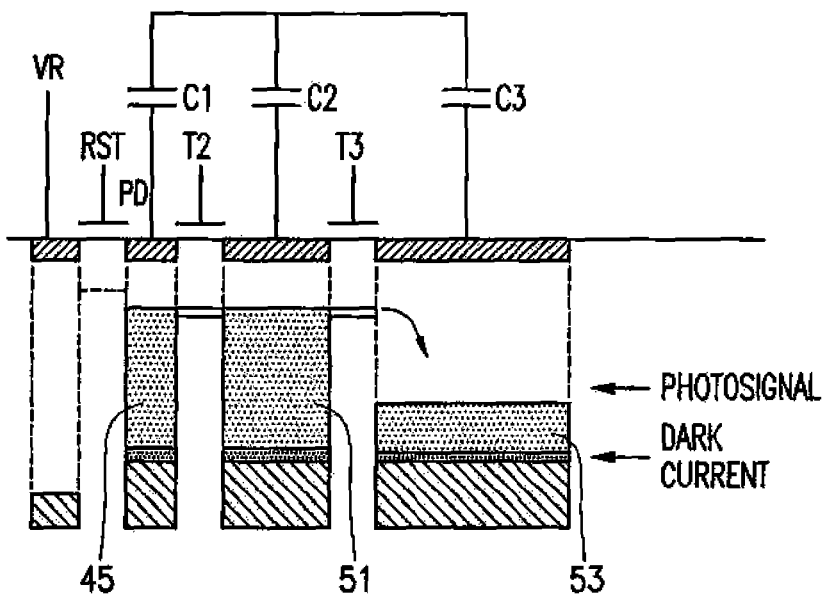
FIG. 14 illustrates a final integration level of the FIG. 1 pixel cell under high light conditions.

The initial reset of the pixel as discussed above with reference to FIG. 1-4 is carried out in a manner described above. Thereafter initial charge accumulation during the integration period as depicted in FIG. 5 occurs with the charge accumulating to the point where it spills over into capacitor 25 as depicted in FIG. 10. Further charge accumulation during a period of high light intensity then causes a further spillover of charge once capacitor 25 reaches its charge storage capacity onto capacitor 26 as depicted in FIG. 14. Thus, the capacitors 24, 25 and 26 successively store the accumulated charges with a spillover occurring from charges stored on capacitor 24 to capacitor 25, and a spillover occurring from charges on capacitor 25 onto capacitor 26. FIG. 14 illustrates a final integration level under high light intensity conditions.

Figure 15:
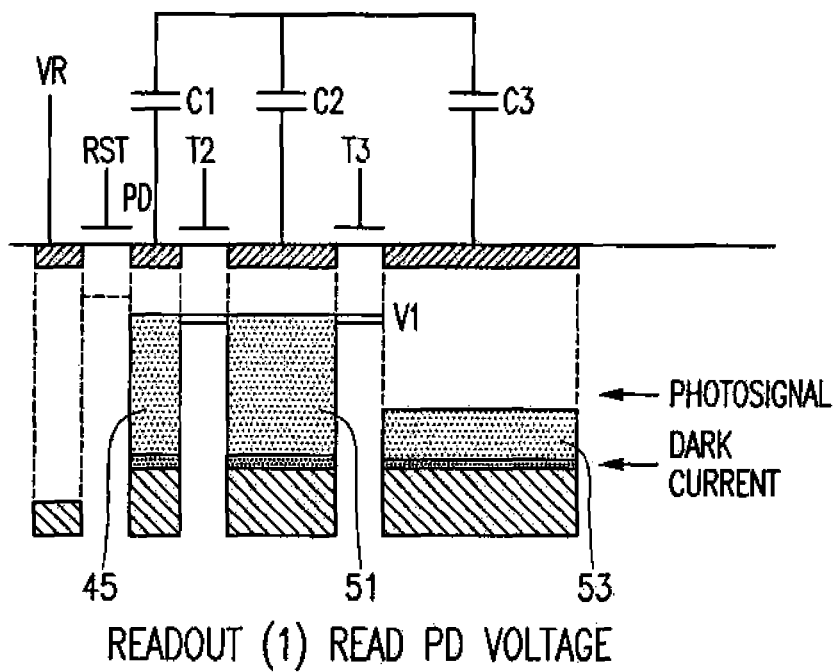
FIG. 15 illustrates a readout of the FIG. 1 pixel cell under high light conditions.
Figure 16:
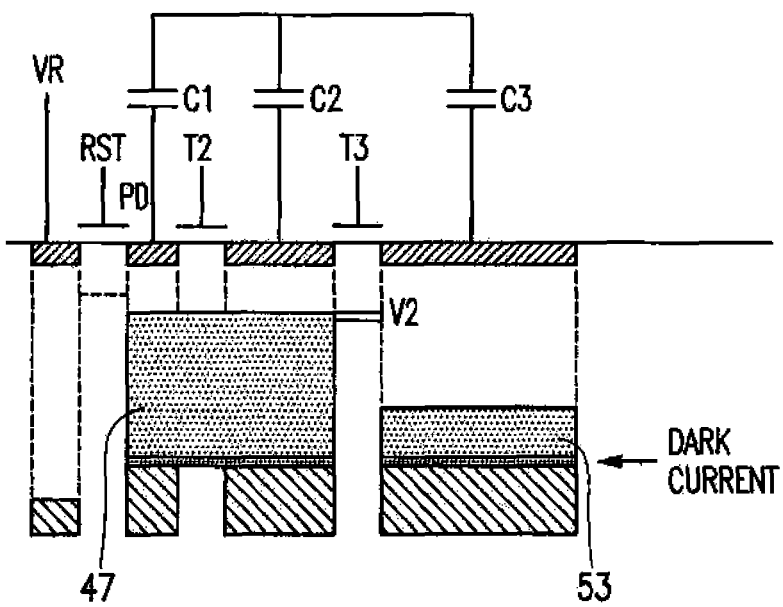
FIG. 16 illustrates a further readout of the FIG. 1 pixel cell under high light conditions.
Figure 17:
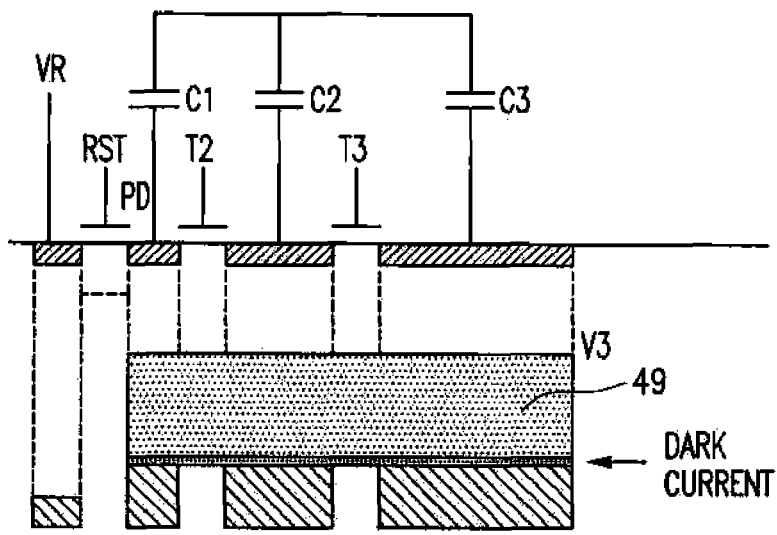
FIG. 17 illustrates a yet further readout of the FIG. 1 pixel cell under high light conditions.

FIGS. 15-17 illustrate the readout of the charge stored on the capacitors 24, 25 and 26. Thus, at the beginning of the readout period, voltage 45 stored on the capacitor 24 at the photodiode is read out (FIG. 15), after which the gate voltage on the transfer transistor 21 is applied to lower the barrier 29, whereby equalized charges on capacitors 24 and 25 are redistributed and the resultant voltage continually read out (FIG. 16). Following this, transfer transistor 22 is turned on as depicted in FIG. 17, whereby its associated barrier level 31 is lowered to redistribute charge on all three capacitors 24, 25 and 26, and the resultant voltage is read out through the source follower transistor 17 and access transistor 13 onto the output line 15.

The FIG. 1 circuit depicted in the operational diagram of FIGS. 2-17 illustrates an integration period in which gate voltages are applied to the transfer transistors 21 and 22, at the same time and same level and throughout the integration to allow spillover from capacitor 24 to capacitor 25, and from capacitor 25 to capacitor 26. It is also possible to operate the FIG. 1 pixel cell whereby the transfer transistors 21 and 22 have their gate voltages T2, T3 sequentially increased so that the barrier potentials associated with these transistors are sequentially lowered during the integration period to allow spillover.

This second method of operating the FIG. 1 pixel cell will now be described with reference to FIGS. 1-4 and 18-30.

Figure 18:
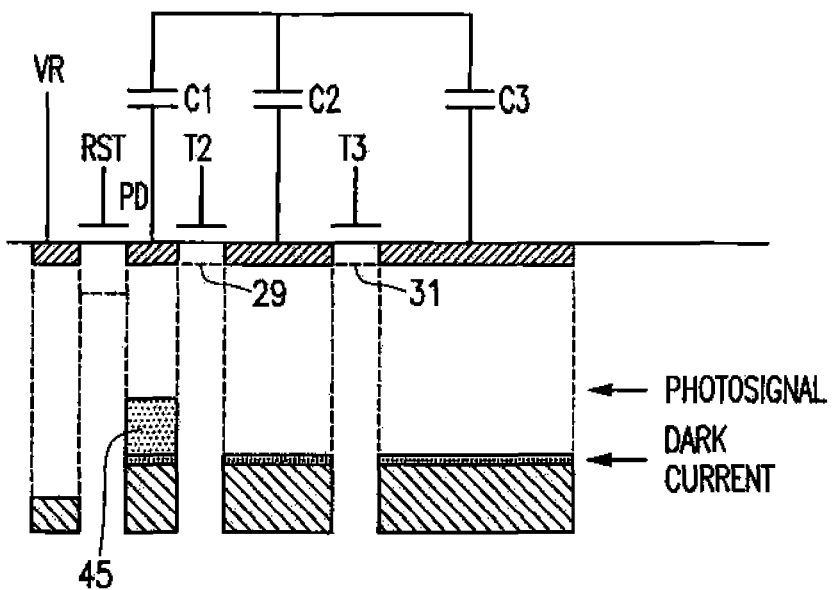
FIG. 18 illustrates operations of the FIG. 1 pixel cell at the beginning of integrating a signal in accordance with a second method of operation.

At the outset of the second method of operating the circuit of FIG. 1, a reset occurs as described above and depicted with reference to FIGS. 2, 3 and 4. Following the reset period, the integration period begins as shown in FIG. 18. At the outset of the integration period, the barrier potential 29 is set by the gate voltage T2 on transistor 21, which equals the barrier potential 31 set by the gate voltage T3 for transistor 22. Charge begins to accumulate at the photodiode 11 and specifically on the first capacitor 24. However, unlike the initial charge accumulation described in the first method of operation (FIGS. 5, 6), the barrier levels 29 and 31, in the second method of operation as depicted in FIG. 18 initially remain high. That is, the gate voltages T2, T3 for transfer transistors 21 and 22 are set so that these transistors are completely off.

Figure 19:
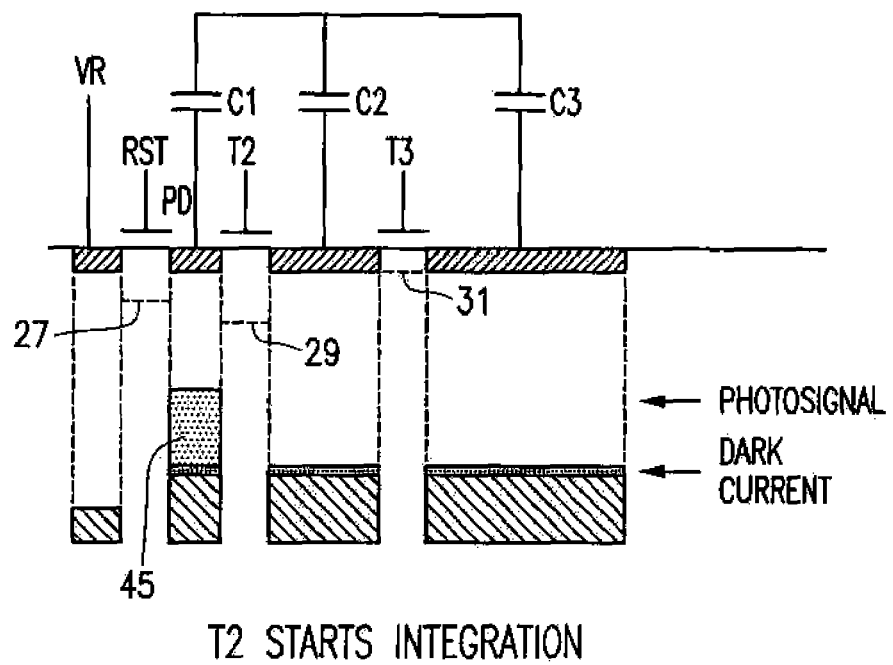
FIG. 19 illustrates operations of the FIG. 1 pixel cell in further integrating a signal in accordance with the second method of operation.
Figure 20:
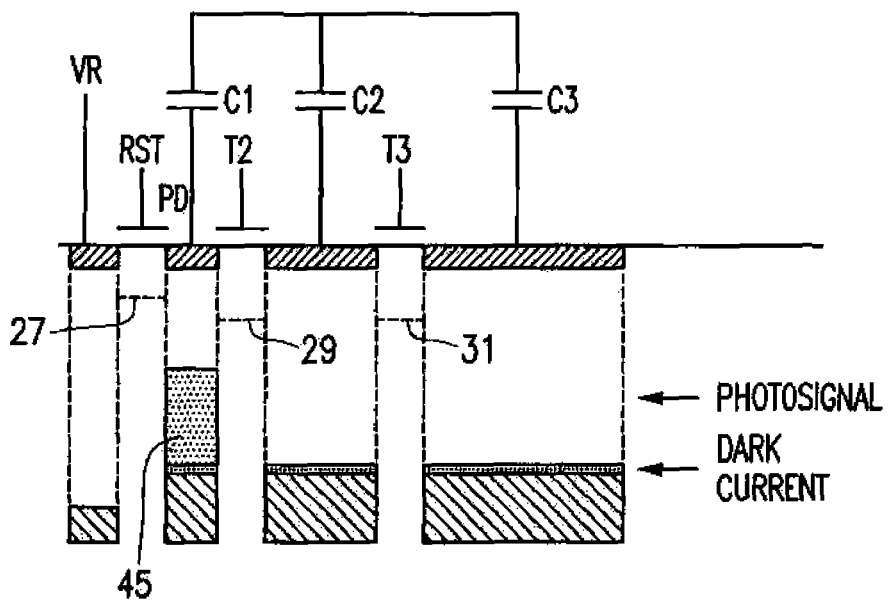
FIG. 20 further illustrates die integration of the FIG. 1 pixel cell signal in accordance with the second method of operation.
Figure 21:
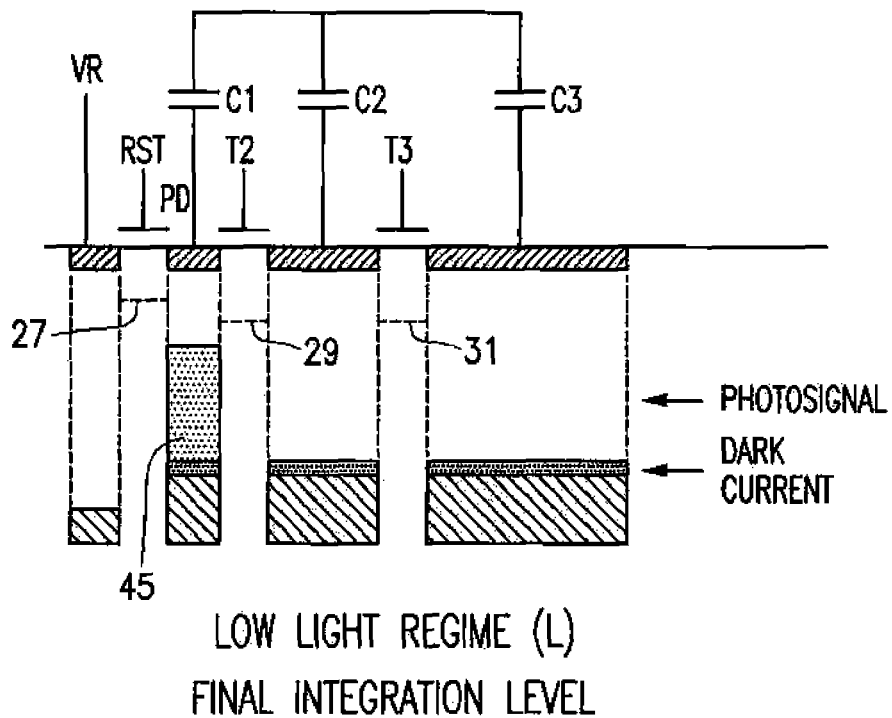
FIG. 21 illustrates a final integration level of the FIG. 1 pixel cell in accordance with the second method of operation.
Figure 22:
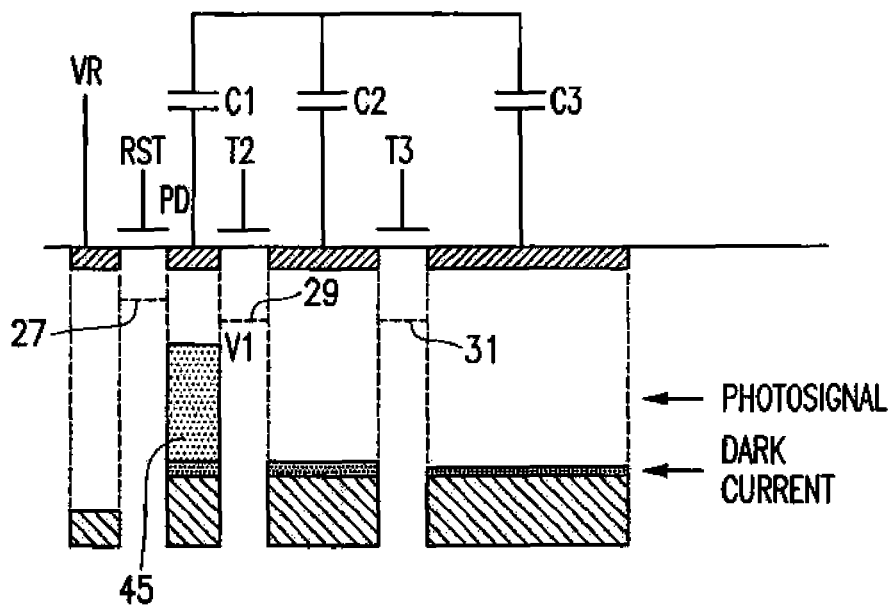
FIG. 22 illustrates a readout of the FIG. 1 pixel cell in accordance with the second method of operation.
Figure 23:
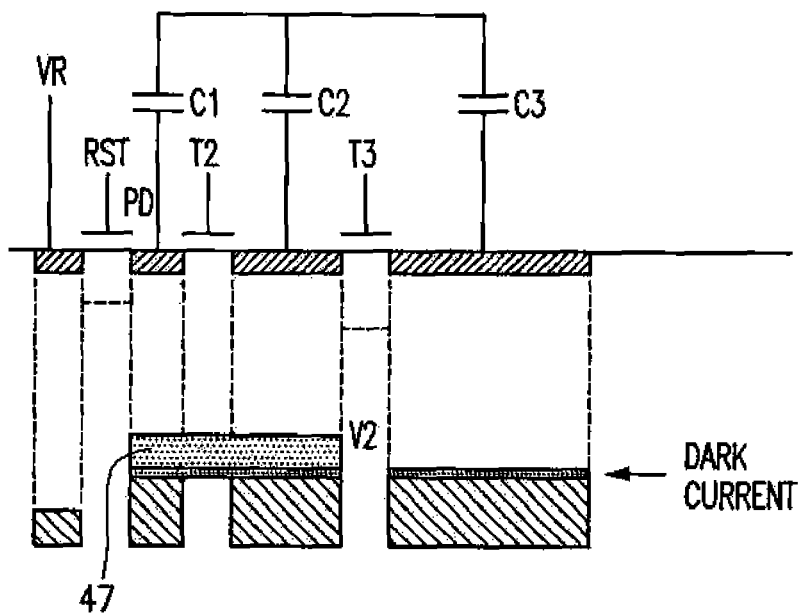
FIG. 23 illustrates a further readout of the FIG. 1 pixel cell in accordance with the second method of operation.
Figure 24:
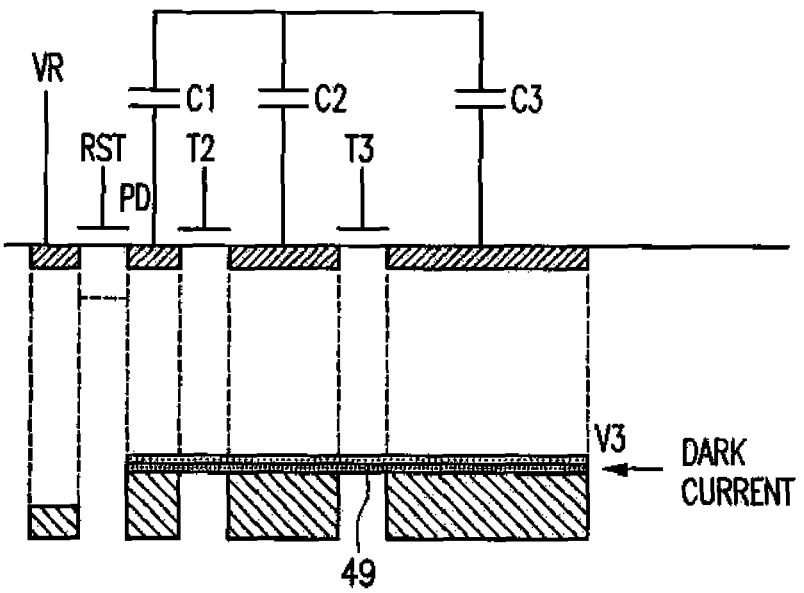
FIG. 24 further illustrates the readout of the FIG. 1 pixel cell in accordance with the second method of operation.

As charge is accumulating at the photodiode 11, the first transfer transistor 21 receives a gate voltage which partially lowers the barrier level 29 as depicted in FIG. 19. At this time, transfer transistor 22 is still completely off and has a higher barrier level of 31. As charges continue to accumulate at the photodiode 11, transfer transistor 22 also turns on as illustrated by the lower barrier level 31 depicted in FIG. 20. With both transfer transistors 21 and 22 on, charges continue to accumulate at the photodiode 11 as depicted in FIG. 21. If the charges accumulated at the photodiode 11 during the integration period do not exceed the barrier level 29, then readout occurs and then there is no spillover of charge onto capacitor 25 from capacitor 24. Thus, subsequent readout occurs as shown in FIG. 22 of the voltage on capacitor 24, followed by a lowering of the gate potential of the barrier potential 29 for transfer transistor 21, which redistributes charge on capacitors 24 and 25, and the resultant voltage continues to be read out. Subsequently, as shown in FIG. 24, the gate voltage T2 on the transfer transistor 22 is applied which is sufficient to lower the barrier 31 to where the residual charge is now redistributed on all capacitors 24, 25 and 26, and the resultant voltage continues to be read out onto output line 15.

Figure 25:
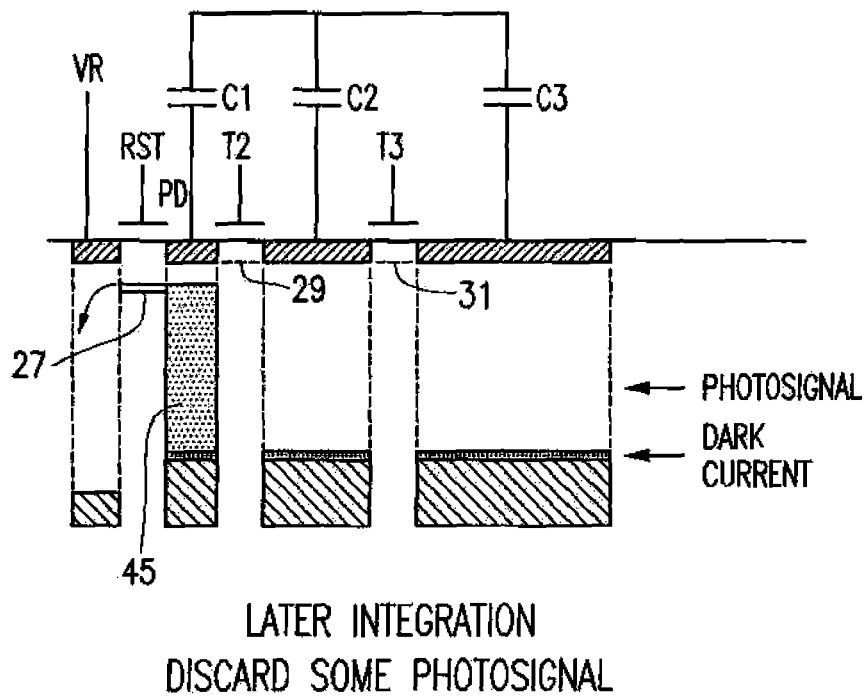
FIG. 25 illustrates another aspect of charge accumulation of the FIG. 1 pixel cell in accordance with the second method of operation.
Figure 26:
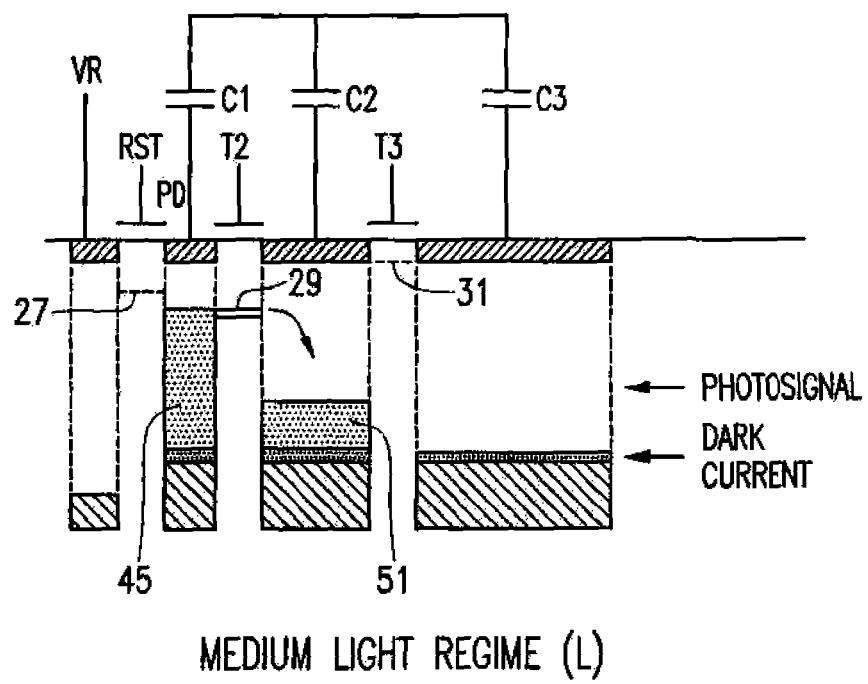
FIG. 26 illustrates the operation of the FIG. 1 pixel cell in accordance with the second method of operation.

Because the transfer transistors 21 and 22 are turned on after charge accumulation begins, it is possible to operate the pixel cell of FIG. 1 to dump some charge if there is a possibility that the accumulated charge might saturate the storage capability of all three capacitors 24, 25 and 26, for example, under very bright light conditions. This operation of the FIG. 1 circuit is depicted in FIG. 25. As shown during an initial integration period, and while the barrier potentials 29 and 31 remain high (transistors 21 and 22 completely off), any excess charge accumulated at the photodiode and on capacitor 24 spills over through the reset transistor 23 to the voltage source VR where it is effectively lost. Thereafter, as depicted in FIG. 26, the barrier potential 29 of the transfer transistor 21 is lowered below the level of the barrier 27 associated with the reset transistor, so that charge on capacitor 24 now spills over onto capacitor 25. The charge 51 on capacitor 25 then is accumulated, and after a predetermined period during the integration period the barrier potential 31 associated with transfer transistor 22 is lowered, as shown in FIG. 27, to allow any charge which exceeds the charge storage capability of capacitor 25 to spill over into or onto capacitor 26.

Figure 27:
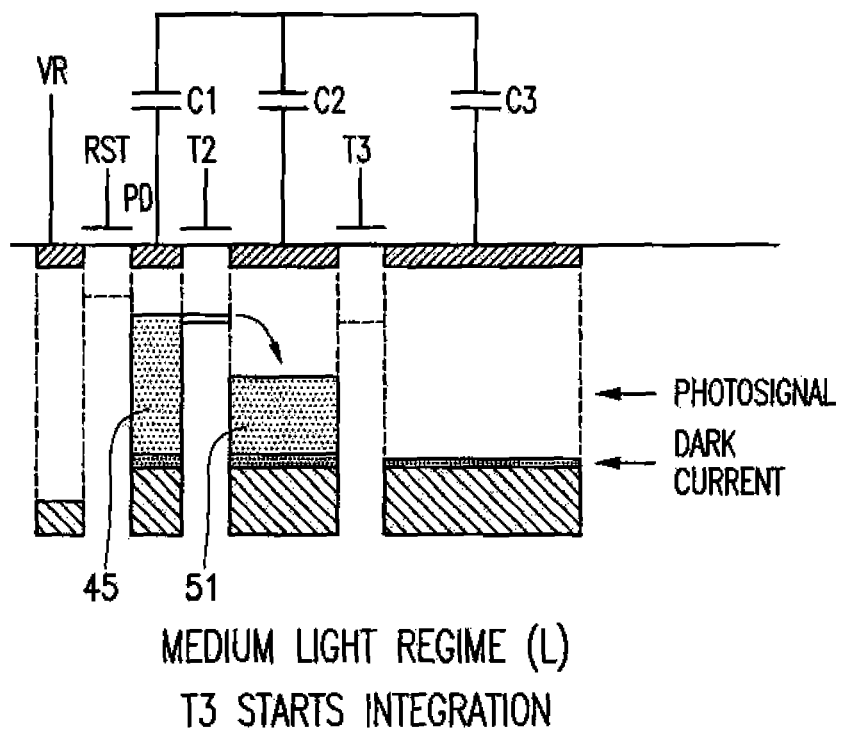
FIG. 27 illustrates a further operation of the FIG. 1 pixel cell in accordance with the second method of operation.
Figure 28:
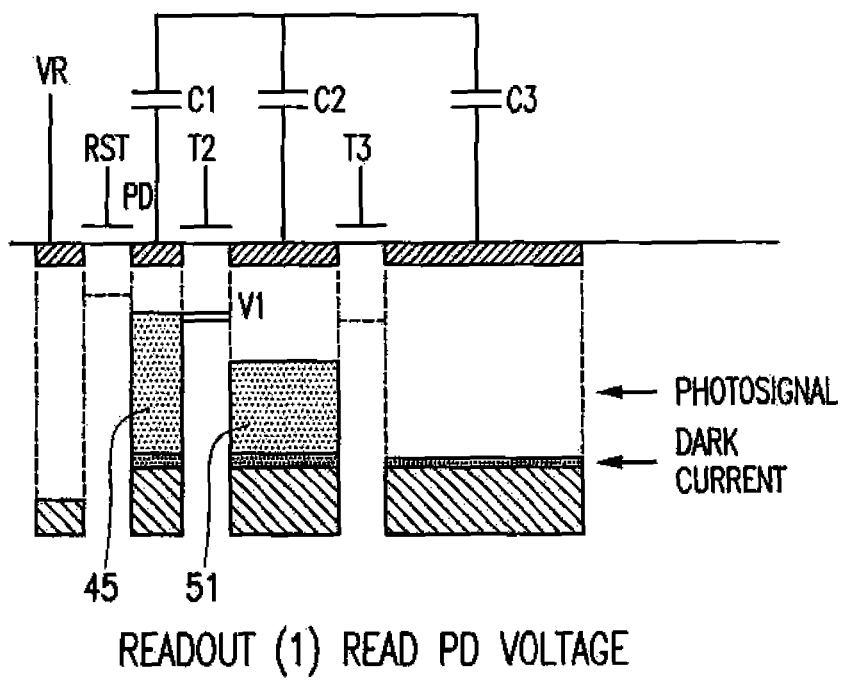
FIG. 28 illustrates the readout of the FIG. 1 pixel cell in accordance with the second method of operation.
Figure 29:
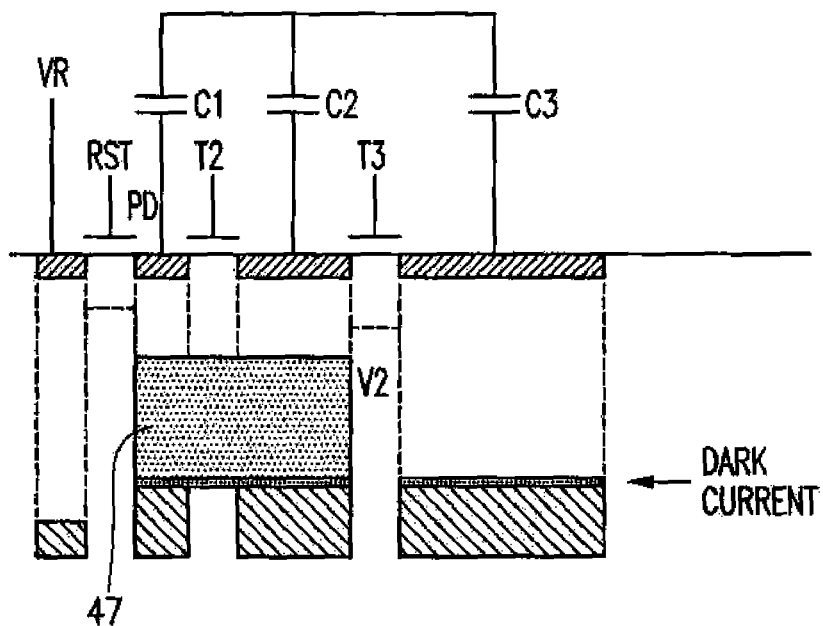
FIG. 29 further illustrates the readout of the FIG. 1 pixel cell in accordance with the second method of operation.
Figure 30:
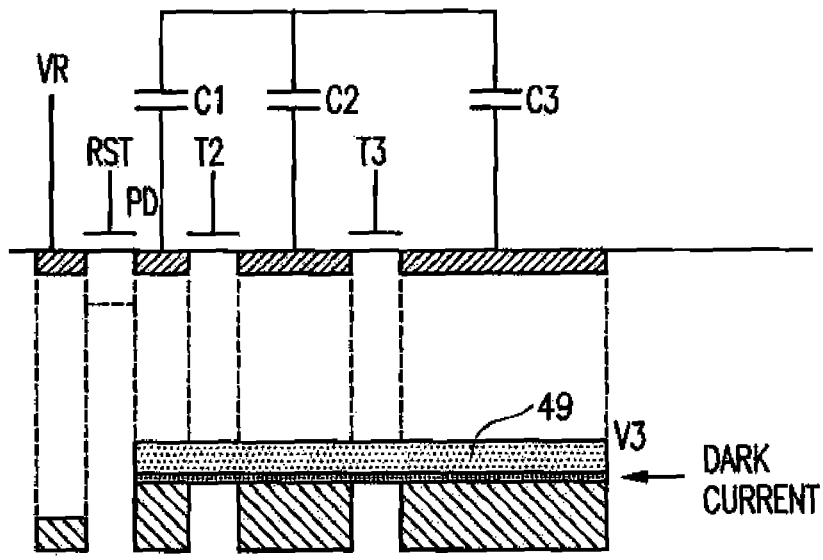
FIG. 30 further illustrates a readout of the FIG. 1 pixel cell in accordance with the second method of operation.

FIG. 27 illustrates the situation where capacitor 25 is capable of storing any excess charge spilled over from the photodiode 11 and the corresponding voltage is then read out as shown in FIG. 28, first from the capacitor 24 and then from both capacitors 24 and 25 by the lowering of the barrier potential 29 associated with transfer transistor 21, as depicted in FIG. 29. Finally, during the final stage of readout the transfer transistor 22 is also turned on, while transistor 21 remains on, so that remaining charge is redistributed across all three capacitors 24, 25, 26 and the resulting voltage read out.

A further operation of the FIG. 1 circuit in accordance with the second method of operation under a high intensity light condition will now be described.

Figure 31:
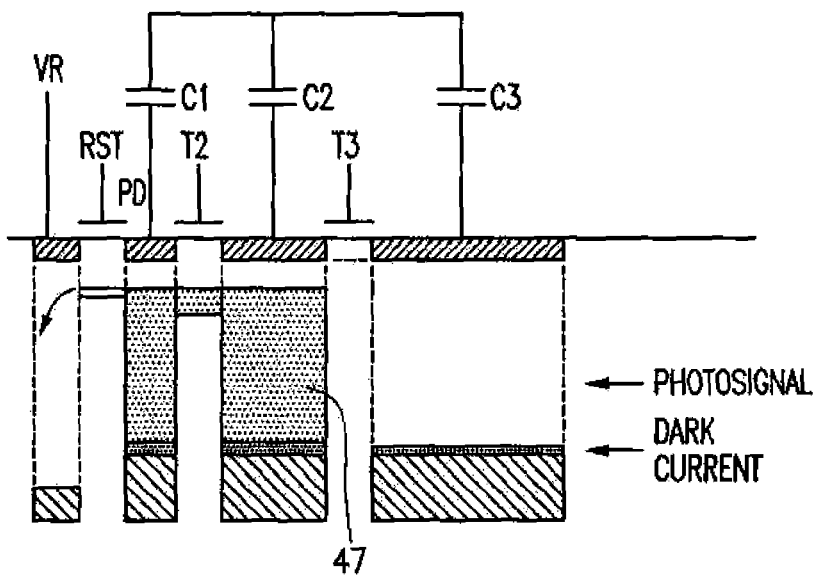
FIG. 31 illustrates operation of the FIG. 1 pixel cell in accordance with the second method of operation.
Figure 32:
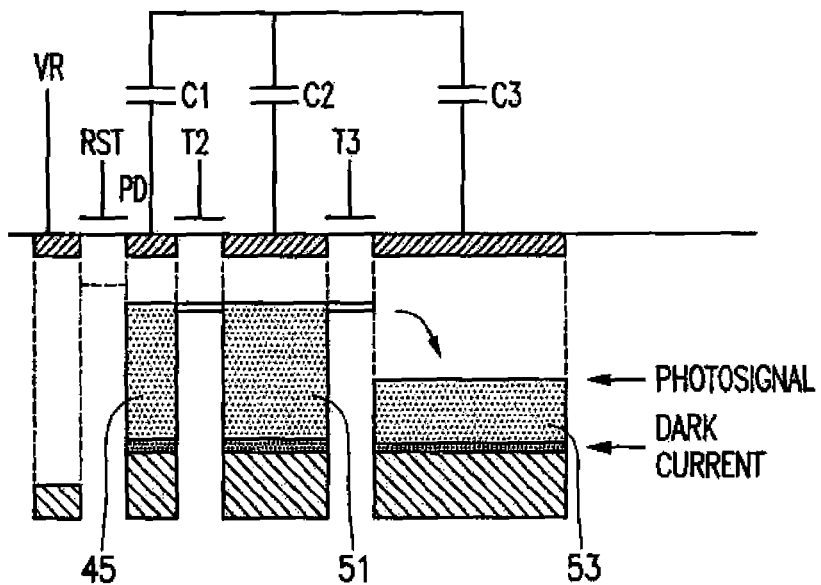
FIG. 32 illustrates further operation of the FIG. 1 pixel cell in accordance with the second method of operation.

During the operation of the pixel circuit of FIG. 1 under the second operating method, if the charges stored on the capacitors 24 and 25 exceed a predetermined value as set by the level of the gate voltage on the reset transistor 23, and before the transfer transistor 22 lowers its barrier potential 31, the excess charge can spill over through the reset transistor 23 to the voltage source VR as shown in FIG. 31. Thereafter, as shown in FIG. 32, when the transfer transistor 22 lowers its barrier potential 31, spillover of excess charge from that stored on capacitors 24 and 25 can occur, and the excess charges are accumulated as charges 53 on the third capacitor 26.

Figure 35:
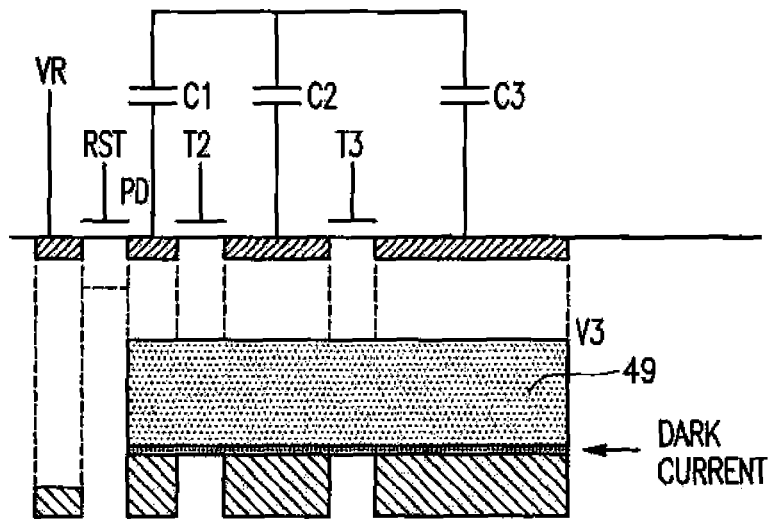
FIG. 35 illustrates a readout of the FIG. 1 pixel cell in accordance with a third method of operation.

Assuming the integration period ends with the stored charges as illustrated in FIG. 33, voltage is first read out from capacitor 24 as shown in FIG. 33, followed by a readout of the voltage on capacitors 24 and 25, as illustrated in FIG. 34, followed by readout of redistributed charges as a voltage stored on capacitors 24, 25 and 26, as illustrated in FIG. 35. Thus, in FIG. 33 the gate voltage on the transfer transistors 21 and 22 is such that voltage readout only occurs from the first capacitor 24, while during readout the gate voltage T2 lowers the barrier potential 29 for transfer transistor 21 allowing readout of voltage on both capacitors 24 and 25, as depicted in FIG. 34. Later during the readout period the gate voltage T3 applied to transfer transistor 22 lowers the barrier potential 31 for this transistor while the barrier potential for transistor 21 remains low, allowing for readout of voltage on three of the capacitors 24, 25 and 26, as depicted in FIG. 35.

Figure 36:
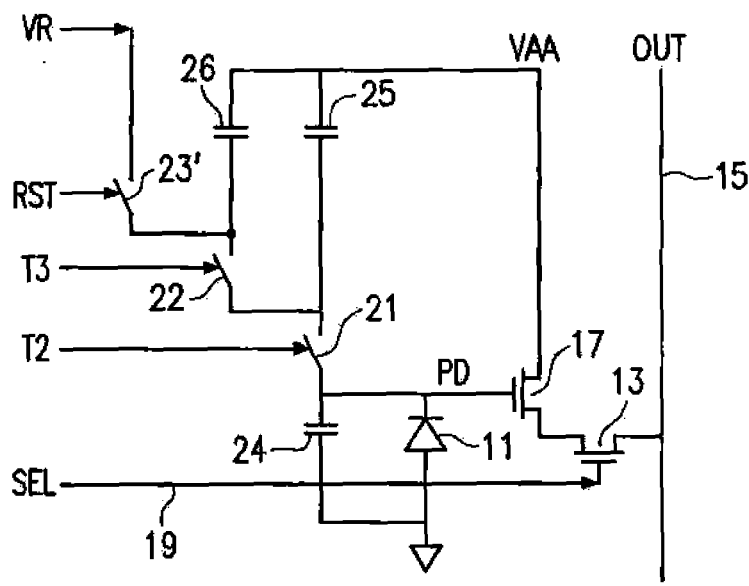
FIG. 36 illustrates a second embodiment of a pixel all in accordance with the invention.

Thus far the invention has been described with reference to the specific pixel circuit illustrated in FIG. 1, and two alternative methods of operating the pixel circuit during charge integration. Another embodiment of a pixel cell in accordance with the invention is illustrated in FIG. 36. In FIG. 36, like elements to those in FIG. 1 contain the same reference numbers. Accordingly, the major difference in the circuit of FIG. 36 compared with that of FIG. 1 is that the reset transistor, now designated as 23', couples the reset voltage VR directly to one terminal of the third capacitor 26, rather than applying the reset voltage VR to the photodiode 11.

Figure 37:
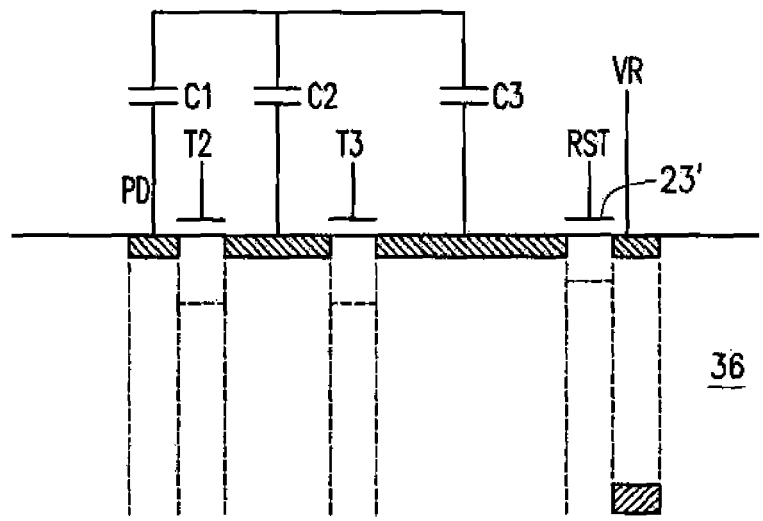
FIG. 37 illustrates the FIG. 36 embodiment as fabricated on a semiconductor substrate.

The fabrication of the FIG. 36 circuit in a semiconductor substrate 36 is illustrated in FIG. 37. As shown, the reset transistor 23' couples a source/drain region thereof which is connected to the reference voltage VR directly to one terminal of the capacitor 26 which is connected to another source/drain region of reset transistor 23'.

As also illustrated in FIG. 37, the gate voltages T2, T3 are applied to the transfer transistors 21 and 22 such that the barrier potentials 29 and 27 are lowered to allow the reset voltage VR to move through transistors 21 and 22 to photodiode 11. Other than reconfiguring the manner in which the reset voltage is applied, the FIG. 36 pixel cell is operated in accordance with the two methods described above associated with the operation of the FIG. 1 pixel circuit. The only other difference is that there can be no charge spillover operation from the photodiode 11 through the reset transistor to the voltage source such as illustrated in FIG. 31. Other than these noted differences, the FIG. 36 pixel cell can operate in the two operating modes described above with reference to the FIG. 1 pixel cell.

Figure 38:
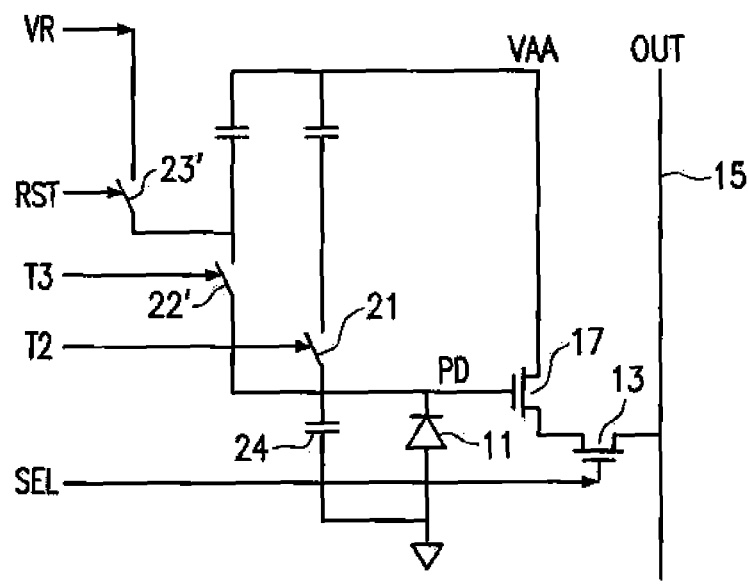
FIG. 38 illustrates a third embodiment of a pixel cell in accordance with the invention.

FIG. 38 illustrates another circuit variation in accordance with the invention in which the arrangement of the transfer transistors 21 and 22' are now such that the reset transistor 23' resets the pixel cell by applying a voltage to one terminal of capacitor 26, in the manner illustrated in FIG. 36, but the transfer transistor 22', rather than being connected to the one terminal of capacitor 25 is now connected directly to the photodiode 11 and capacitor 24. Thus, reset of the pixel is accomplished by turning on the reset transistor 23' as well as the transfer transistors 21 and 22', after which the FIG. 38 pixel cell can be operated by the two methods described above with reference to the FIG. 1 pixel cell. Again, since reset voltage VR is applied to the capacitor 26, in the FIG. 38 arrangement there can be no spillover of excess charge from the photodiode 11 through an on reset transistor to the voltage source VR unless transfer transistor 22' is also on to allow such spillover.

Figure 39:
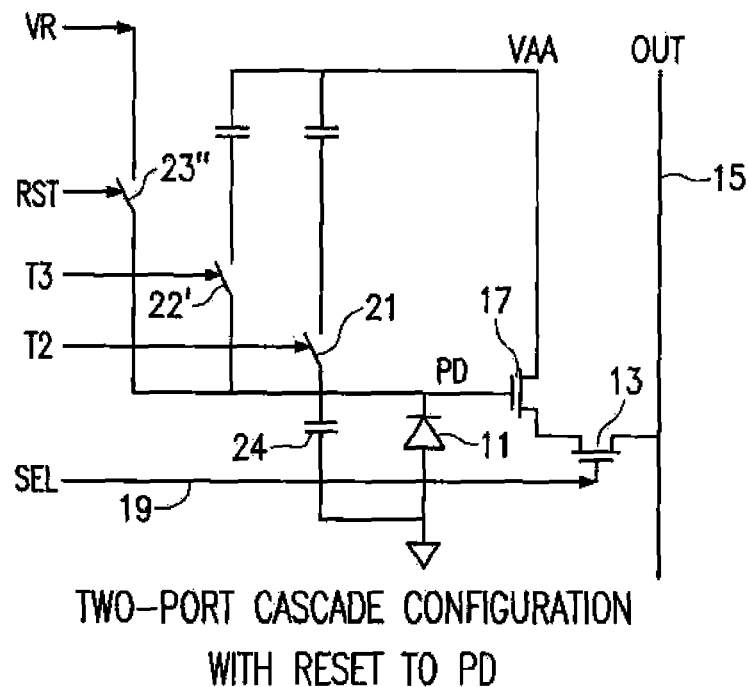
FIG. 39 illustrates a fourth embodiment of a pixel cell in accordance with the invention.
Figure 40:
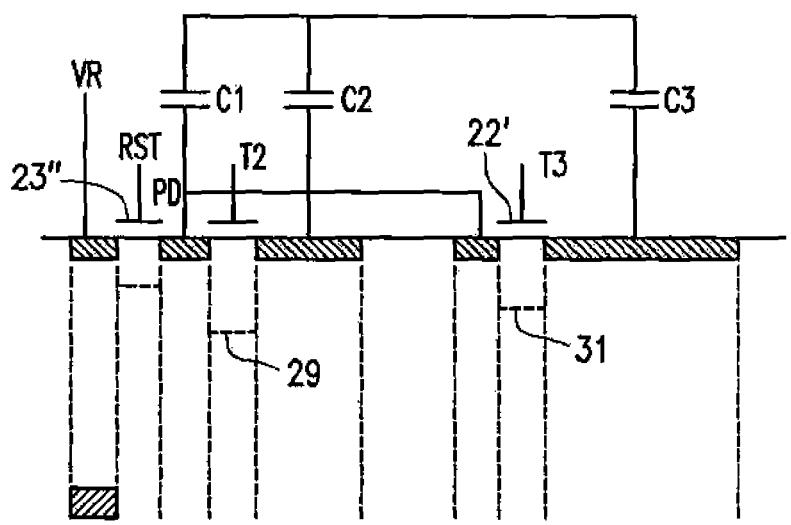
FIG. 40 illustrates the FIG. 39 embodiment as fabricated on a semiconductor substrate.

Another variation of the FIG. 1 pixel cell is illustrated in FIG. 39. In this arrangement the reset transistor 23" resets the photodiode 11 node voltage, while capacitors 25 and 26 are also connected to the photodiode node by respective transfer transistors 21 and 22'. The arrangement of the FIG. 39 circuit in a semiconductor substrate 36 is depicted in FIG. 40, with initial representative barrier levels 29, 31 for the beginning of integration shown.

Without being limiting, exemplary values which can be used for capacitors 24, 25 and 26 are approximately 2 fF, approximately 5.5 fF and about 20.5 fF, respectively. With such values, the first capacitors 24, 25, 26 can respectively store approximately 12,000 electrons, approximately 35,000 electrons and approximately 171,000 electrons.

The invention thus provides for a cascaded operation of a pixel cell in which charges successively flow from a first capacitor associated with the photodiode which converts photons to electrons to a second capacitor, and from a second capacitor to a third capacitor, depending on the intensity of the impinging light signal on the pixel. Thus, charges which would otherwise saturate a storage node of a pixel having just a photodiode node for accumulating charge can be preserved and read out. This provides for a higher intrascene dynamic range for the pixel. The pixel cell of the invention can also be arranged in several different ways and operated in different ways as described above to allow versatility during the charge integration, reset and readout periods.

While the invention has been described and illustrated with respect to specific embodiments, it is apparent that many modifications can be made without departing from the spirit and scope of the invention. Accordingly, the invention is not to be considered as limited by the foregoing description, but is only limited by the scope of the appended claims.

What is claimed as new and desired to be protected by Letters Patent of the United States is:

1. A semiconductor device comprising:
   a photo-conversion node;
   a first charge storage node configured to store charge generated by the photo-conversion node;
   a second charge storage node configured to store charge generated by the photo-conversion node when the charge exceeds a limit, wherein the limit is the charge storage capacity of the first charge storage node;
   a third charge storage node configured to store charge generated by the photo-conversion node when the charge exceeds the combined storage capacity of the first and second charge storage nodes;
   a transistor coupled between the first and second charge storage nodes and configured to transfer charge to the second charge storage node when the charge exceeds the limit; and
   a second transistor coupled between the second and third charge storage nodes and configured to transfer charge to the third charge storage node when the charge exceeds the combined storage capacity of the first and second charge storage nodes.

* * * * *